United States Patent
Kartschoke et al.

(12)

(10) Patent No.: US 6,201,425 B1
(45) Date of Patent: Mar. 13, 2001

(54) METHOD AND APPARATUS FOR REDUCING CHARGE SHARING AND THE BIPOLAR EFFECT IN STACKED SOI CIRCUITS

(75) Inventors: Paul D. Kartschoke, Williston; Norman J. Rohrer, Underhill, both of VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/236,930

(22) Filed: Jan. 25, 1999

(51) Int. Cl.[7] .................................................. H03K 3/0233
(52) U.S. Cl. ......................... 327/211; 327/212; 326/95; 326/96
(58) Field of Search ................................ 326/93, 95–98; 327/199, 200, 201, 208, 209, 210, 211, 212, 218

(56) References Cited

U.S. PATENT DOCUMENTS

| | | | |
|---|---|---|---|
| 4,415,819 | 11/1983 | Mathes | 326/97 |
| 5,703,501 | 12/1997 | Geisler | 326/96 |
| 5,736,888 | 4/1998 | Sharpe-Geisler | 327/382 |
| 5,793,228 | 8/1998 | Evans | 326/98 |
| 6,002,271 | * 12/1999 | Chu et al. | 326/98 |
| 6,025,739 | * 12/1999 | Campbell et al. | 326/83 |

* cited by examiner

Primary Examiner—Tuan T. Lam
(74) Attorney, Agent, or Firm—Dugan & Dugan; Eugene I. Shkurko; Peter W. Peterson

(57) ABSTRACT

A top clock stacked circuit is provided that substantially prevents charge sharing and that prevents any deleterious bipolar effect. The top clock stacked circuit comprises a primary pre-charge circuit coupled to a primary node, a first device coupled between the primary node and a first secondary node, and a second device coupled between the first secondary node and a second secondary node. A second pre-charge circuit is coupled to the first secondary node and a pre-discharge circuit is coupled to the second secondary node. In response to a first clock polarity, the primary and the second pre-charge circuits pre-charge the primary and the first secondary nodes, respectively, and the pre-discharge circuit pre-discharges the second secondary node. Thereafter, in response to a second clock polarity, the first device creates a path between the primary node and the first secondary node. Because both nodes are pre-charged to the same voltage, charge sharing is substantially prevented. Further, because the second secondary node is pre-discharged, the second device is not susceptible to the bipolar effect.

17 Claims, 3 Drawing Sheets

METHOD AND APPARATUS FOR REDUCING CHARGE SHARING AND THE BIPOLAR EFFECT IN STACKED SOI CIRCUITS

FIELD OF THE INVENTION

The present invention relates to stacked circuits and more specifically to a method and apparatus for reducing charge sharing and the bipolar effect in stacked SOI circuits.

BACKGROUND OF THE INVENTION

The use of stacked circuits comprising a plurality of series connected metal-oxide-semiconductor field-effect-transistors (MOSFETs) for logic functions is well known. FIG. 1 is a schematic diagram of a traditional stacked circuit 101 that performs an AND function.

The traditional stacked circuit 101 comprises in pertinent part an n-channel MOSFET (NFET) stack 103 coupled to a dynamic node pre-charge circuit 105 via a dynamic node 107. The NFET stack 103 comprises a first NFET 109 having a drain coupled to the dynamic node 107, a source coupled to a first node 111 and a gate which serves as an "A" input, a second NFET 113 having a drain coupled to the first node 111, a source coupled to a second node 115 and a gate which serves as a "B" input, and a third NFET 117 having a drain coupled to the second node 115, a source coupled to ground and a gate which serves as a clock (CLK) input.

The dynamic node pre-charge circuit 105 comprises a first p-channel MOSFET (PFET) 119 having a source coupled to a positive voltage rail ($V_{DD}$), a drain coupled to the dynamic node 107 and a gate which serves as a CLK input; and a second PFET 121 having a source coupled to $V_{DD}$, a drain coupled to the dynamic node 107 and a gate coupled to the dynamic node 107 via an inverter 123. An output of the inverter 123 serves as the output of the traditional stacked circuit 101.

Assuming the dynamic node 107 initially is uncharged, when a low voltage ("low") clock polarity is fed to each CLK input, the third NFET 117 is turned OFF and the first PFET 119 is turned ON. With the first PFET 119 ON, the dynamic node 107 charges toward the voltage $V_{DD}$. As the dynamic node 107 charges toward $V_{DD}$, the switching threshold of the inverter 123 is passed, the gate of the second PFET 121 is driven low and the second PFET 121 is turned ON to assist in the charging of the dynamic node 107.

With the dynamic node 107 charged to $V_{DD}$, the output of the traditional stacked circuit 101 is driven to a low logic state via the inverter 123. Thereafter, when the CLK polarity is switched to a high voltage ("high") clock polarity, the third NFET 117 is turned ON (grounding the second node 115), the first PFET 119 is turned OFF, and the traditional stacked circuit 101's output logic state is dictated by the voltage states present on the A and the B inputs of the first NFET 109 and the second NFET 113, respectively. For instance, if the B input is held low, the second NFET 113 is OFF and no path can be created between the dynamic node 107 and ground whether the first NFET 109 is ON or OFF (e.g., whether the A input is held high or low). Therefore, the dynamic node 107 remains charged at $V_{DD}$, and the output of the traditional stacked circuit 101 remains low. Similarly, if the A input is held low, the first NFET 109 is OFF and no path can be created between the dynamic node 107 and ground whether the second NFET 113 is ON or OFF (e.g., whether the B input is held high or low). The dynamic node 107, therefore, remains charged at $V_{DD}$, and the output of the traditional stacked circuit 101 remains low.

Only when both the A input and the B input are driven high are both the first NFET 109 and the second NFET 113 turned ON, is a path created between the dynamic node 107 and ground, is the dynamic node 107 pulled low, and is the output of the traditional stacked circuit 101 switched from a low to a high logic state. The traditional stacked circuit 101 thus functions as an AND gate when the CLK input is held high as summarized in TABLE 1.

TABLE 1

| A | B | OUT |
|---|---|-----|
| 0 | 0 | 0 |
| 0 | 1 | 0 |
| 1 | 0 | 0 |
| 1 | 1 | 1 |

The above described operation of the traditional stacked circuit 101 represents the "ideal" operation of the traditional stacked circuit 101. However, two phenomena known as "charge sharing" and the "bipolar effect" can cause the traditional stacked circuit 101 to deviate from its ideal behavior. Charge sharing is the unintentional transfer of charge from the dynamic node 107 that can cause the dynamic node 107 to be pulled below the switching threshold of the inverter 123 so that the traditional stacked circuit 101's output is erroneously switched to a high logic state. For instance, assume the CLK polarity is low, the first node 111 and the second node 115 are at a low voltage and the dynamic node 107 is charged to $V_{DD}$. Ideally, if the CLK polarity is switched high, the A input is switched high and the B input is held low, the output of the traditional stacked circuit 101 remains low as shown in TABLE 1. However, with the first node 111 at a low voltage, when the first NFET 109 turns on due to the A input being held high, charge is transferred from the dynamic node 107 to the first node 111 (e.g., charge sharing occurs). The amount of charge transferred from the dynamic node 107 to the first node 111 depends on the ratio of the capacitances of the dynamic node 107 and the first node 111, but may be sufficient to pull the voltage of the dynamic node 107 below the switching threshold of the inverter 123 so that an erroneous high logic state is output by the traditional stacked circuit 101.

FIG. 2 is a schematic diagram of a conventional pre-charged stacked circuit 201 that overcomes the charge sharing problems of the traditional stacked circuit 101 of FIG. 1. The conventional pre-charged stacked circuit 201 comprises all of the components of the traditional stacked circuit 101, plus a third PFET 203 and a fourth PFET 205. The third PFET 203 has a source coupled to $V_{DD}$, a drain coupled to the first node 111 and a gate which serves as a CLK input. The fourth PFET 205 has a source coupled to $V_{DD}$, a drain coupled to the second node 115 and a gate which serves as a CLK input.

The conventional pre-charged stacked circuit 201 operates identically to the traditional stacked circuit 101 except that when the CLK polarity is low, both the third PFET 203 and the fourth PFET 205 are ON. Thus, the first node 111 and the second node 115 are "pre-charged" to $V_{DD}$ when the CLK polarity is low. Thereafter, when the CLK polarity is switched high, and if the A input is switched high and the B input is held low (the condition that resulted in charge sharing within the traditional stacked circuit 101), no charge sharing occurs between the dynamic node 107 and the first node 111 because the first node 111 is pre-charged to $V_{DD}$. The dynamic node 107, therefore, remains charged at $V_{DD}$, and the output of the conventional pre-charged stacked circuit 201 remains at its proper logic state (e.g., the low logic state as shown in TABLE 1). Both the traditional stacked circuit 101 and the conventional pre-charged stacked circuit 201, however, are susceptible to the bipolar effect if partially depleted silicon-on-insulator (SOI) transistors are employed for the NFETs 109–117 as described below.

The bipolar effect occurs when the parasitic bipolar transistor within an SOI MOSFET is inadvertently turned ON during an OFF state of the SOI MOSFET. As described below with reference to FIGS. 1–3, the bipolar effect can lead to erroneous switching of a conventional stacked circuit's output logic state.

FIG. 3 is a cross-sectional view of a typical SOI NFET 301 comprising a p-type bulk silicon region 303 having an oxide buried therein (e.g., a buried oxide 305) so as to form a top bulk silicon region 303a and a bottom bulk silicon region 303b. The top bulk silicon region 303a is surrounded by isolation oxidation regions 304. A first and a second n+ diffusion region 307, 309 are formed within the p-type bulk silicon region 303 and serve as the source and drain, respectively, of the SOI NFET 301. A gate oxide 311 and a gate metal 313 are formed over a region 315 of the p-type bulk silicon region 303 that serves as the channel of the SOI NFET 301. From FIG. 3 it can be seen that a parasitic npn transistor 317 (shown in phantom) is formed within the SOI NFET 301 having a collector-base junction formed by the second diffusion region 309 and a base-emitter junction formed by the first diffusion region 307. The base of the parasitic npn bipolar transistor is formed from the top bulk silicon region 303a.

In non-SOI devices, the top p-type bulk silicon region 303a and the bottom p-type bulk silicon region 303b form one continuous p-type bulk silicon region 303 that typically is grounded and/or is tied to the source lead. As such, the base-emitter junction of the parasitic npn transistor 317 cannot be forward biased, and the parasitic npn transistor 317 cannot turn ON. However, in SOI devices the top p-type bulk silicon region 303a is electrically isolated from the bottom p-type bulk silicon region 303b by the buried oxide 305 so that the base of the parasitic npn transistor 317 floats. Thus, under certain biasing conditions, the base-emitter junction of the parasitic npn transistor 317 can forward bias and the parasitic npn transistor 317 can turn ON (e.g. the bipolar effect). Note that if the SOI NFET 301 is ON, the source and the drain of the parasitic npn transistor 317 are connected by a conducting channel, the base-emitter junction of the parasitic npn transistor 317 cannot sufficiently forward bias to turn ON the parasitic npn transistor 317, and the bipolar effect does not result.

With reference to FIG. 1, when the CLK polarity is low and the dynamic node 107 is charged to $V_{DD}$, a leakage path typically exists through the first NFET 109 that charges the first node 111 to near $V_{DD}$. Alternatively, the first node 111 may be charged to near $V_{DD}$ due to the previous switching history. Assuming the first NFET 109, the second NFET 113, and the third NFET 117 are SOI devices, the top p-type bulk silicon region 303a of the first NFET 109 also charges to near $V_{DD}$. Thereafter, if both the CLK polarity and the B input are switched high and the A input is held low, the first node 111 (and thus the source of the first NFET 109) is pulled low (e.g., is grounded). With the drain of the first NFET 109 held at $V_{DD}$ (via the dynamic node 107), the source of the first NFET 109 grounded and the top p-type bulk silicon region 303a of the first NFET 109 floating near $V_{DD}$, the parasitic npn transistor 317 within the first NFET 109 turns ON until the charge stored within the top p-type bulk silicon region 303a is drained away. While the parasitic npn transistor 317 of the first NFET 109 is ON, charge is drained from the dynamic node 107 to ground. If sufficient charge from the dynamic node 107 is drained to ground before the parasitic npn transistor 317 turns OFF, the voltage of the dynamic node 107 will fall below the switching threshold of the inverter 123, and the traditional stacked circuit 101s output will erroneously switch to a high logic state.

With reference to FIG. 2, the third PFET 203 guarantees that the first node 111 is charged to $V_{DD}$ when the CLK polarity is low. Thus, the conventional pre-charged stacked circuit 201 is more susceptible to the bipolar effect than is the traditional stacked circuit 101 when the CLK polarity and the B input are switched high while the A input is held low.

FIG. 4 is a schematic diagram of a conventional top clock stacked circuit 401 that reduces the deleterious consequences of the bipolar effect within the traditional stacked circuit 101 of FIG. 1. The conventional top clock stacked circuit 401 is identical to the traditional stacked circuit 101 with the exception that the third NFET 117 has been moved from the bottom to the top of the stack 103 as shown.

In operation, when the CLK polarity is low and the dynamic node 107 is charged to $V_{DD}$, a leakage path typically exists through the third NFET 117 that charges the first node 111 and the top p-type bulk silicon region 303a of the third NFET 117 to near $V_{DD}$. Thereafter, if both the A input and the B input are switched high while the CLK polarity is low, the first node 111 (and thus the source of the third NFET 117) is pulled low. With the drain of the third NFET 117 held at $V_{DD}$ via the dynamic node 107, the source of the third NFET 117 grounded and the top p-type bulk silicon region 303a of the third NFET 117 floating near $V_{DD}$, the parasitic npn transistor 317 within the third NFET 117 turns ON. However, because the CLK polarity is low, the first PFET 119 of the dynamic node pre-charge circuit 105 is ON and the dynamic node 107 thereby is maintained at $V_{DD}$ as the charge within the top p-type bulk silicon region 303a is drained away. Therefore, the bipolar effect within the third NFET 117 has no effect on the output of the conventional top clock stacked circuit 401.

Another bipolar effect nonetheless can occur within the conventional top clock stacked circuit 401 that affects the output of the conventional top clock stacked circuit 401. If the CLK polarity is low, the first node 111 and the second node 115 may charge to a positive voltage (e.g., via leakage paths through the first and the third NFETS 109, 117). Thereafter, if the CLK polarity is switched high, the A input is held low, and the B input is switched high, the drain of the first NFET 109 is coupled to $V_{DD}$ via the dynamic node 107, the source of the first NFET 109 is grounded and the top p-type bulk silicon region 303a of the first NFET 109 floats at a positive voltage. Thus, the parasitic npn transistor 317 within the first NFET 109 may turn ON and sufficient charge may be drained from the dynamic node 107 by the parasitic npn transistor 317 to pull the dynamic node 107 below the switching threshold of the inverter 123 so that the conventional top clock stacked circuit 401's output is erroneously switched to a high logic state.

The conventional top clock stacked circuit 401 also suffers from charge sharing. If the first node 111 and the second node 115 are at a low voltage and the dynamic node 107 is charged to $V_{DD}$, and if the CLK polarity is switched high while the A and the B inputs are held low, charge will be transferred from the dynamic node 107 to the first node 111. If sufficient charge is transferred from the dynamic node 107 to pull the voltage of the dynamic node 107 below the switching threshold of the inverter 123, an erroneous high logic state will be output by the conventional top clock stacked circuit 401.

Accordingly, a need exists for a method and apparatus for preventing both charge sharing and any deleterious bipolar effect in stacked SOI circuits. Such a method and apparatus will greatly improve the reliability of stacked SOI circuits.

SUMMARY OF THE INVENTION

To overcome the needs of the prior art, an inventive top clock stacked circuit is provided that substantially prevents charge sharing (i.e., prevents charge sharing sufficiently to prevent erroneous switching of the stacked circuit's output logic state due to charge sharing) and that prevents any deleterious bipolar effect. The inventive top clock stacked circuit comprises a primary pre-charge circuit coupled to a primary node (e.g., a dynamic node pre-charge circuit coupled to a dynamic node), a first device (e.g., a first NFET) coupled between the primary node and a first secondary node, and a second device (e.g., a second NFET) coupled between the first secondary node and second secondary node. A second pre-charge circuit (e.g., a PFET) is coupled to the first secondary node, and a pre-discharge circuit (e.g., a fourth NFET) is coupled to the second secondary node.

The primary and the second pre-charge circuits pre-charge the primary node and the first secondary node, respectively, in response to a first clock polarity, and the pre-discharge circuit pre-discharges the second secondary node in response to the first clock polarity. The first device couples the primary node to the first secondary node in response to a second clock polarity, and the second device couples the first secondary node to second secondary node in response to a first input signal. As used herein, "in response to" means in direct or indirect response to (e.g., in direct response to a signal, in response to the inverse of the signal, etc.), and "coupled to" means directly or indirectly coupled to so as to operate.

In operation, the inventive top clock stacked circuit receives the first clock polarity, and in response thereto, the primary pre-charge circuit and the second pre-charge circuit pre-charge the primary node and the first secondary node and the pre-discharge circuit pre-discharges the second secondary node. Thereafter, the inventive top clock stacked circuit receives the second clock polarity and the first device couples the primary node to the first secondary node. Because the primary and the first secondary nodes are pre-charged to the same voltage (e.g., a positive voltage rail voltage), charge sharing (e.g., charge transfer) between the two nodes is prevented.

Further, because the second secondary node is pre-discharged, the second device is not susceptible to the bipolar effect and the parasitic current flow associated therewith. For instance, if the second device is an SOI NFET having a drain coupled to the first secondary node and a source coupled to the second secondary node, pre-discharging the second secondary node prevents the floating bulk silicon region of the SOI NFET from charging to a voltage sufficient to forward bias the base-emitter junction of the NFET's parasitic bipolar transistor. The bipolar effect thereby is prevented. The inventive top clock stacked circuit thus prevents both charge sharing and any deleterious bipolar effect therewithin.

Other objects, features and advantages of the present invention will become more fully apparent from the following detailed description of the preferred embodiments, the appended claims and the accompanying drawings.

BRIEF DESCRIPTION OF THE DRAWINGS

The present invention is described with reference to the accompanying drawings. In the drawings, like reference numbers indicate identical or functionally similar elements. Additionally, the left-most digit of a reference number identifies the drawing in which the reference number first appears.

DETAILED DESCRIPTION OF THE PREFERRED EMBODIMENTS

Figure 4:
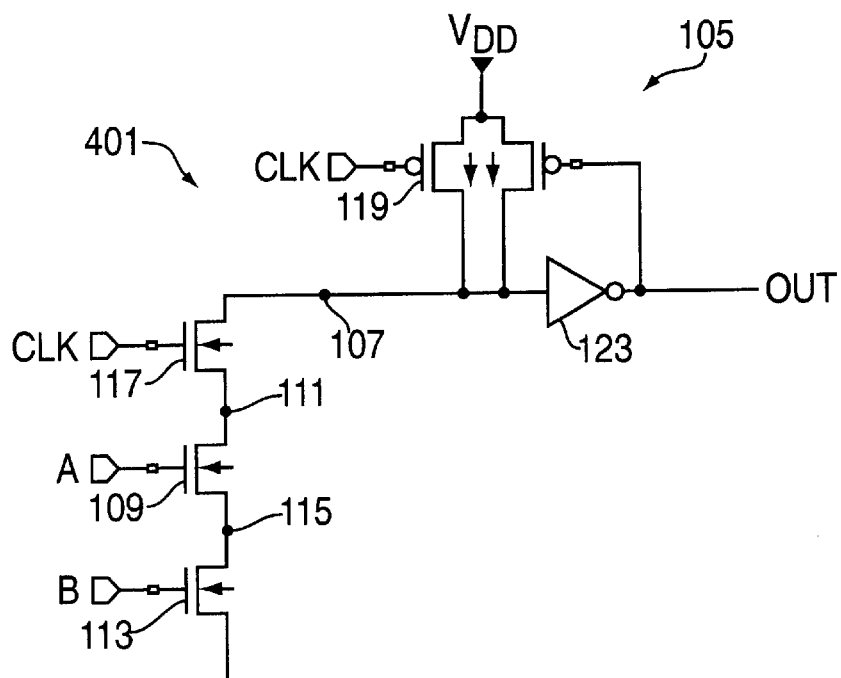
FIG. 4 is a schematic diagram of a conventional top clock stacked circuit, as previously described.
Figure 5:
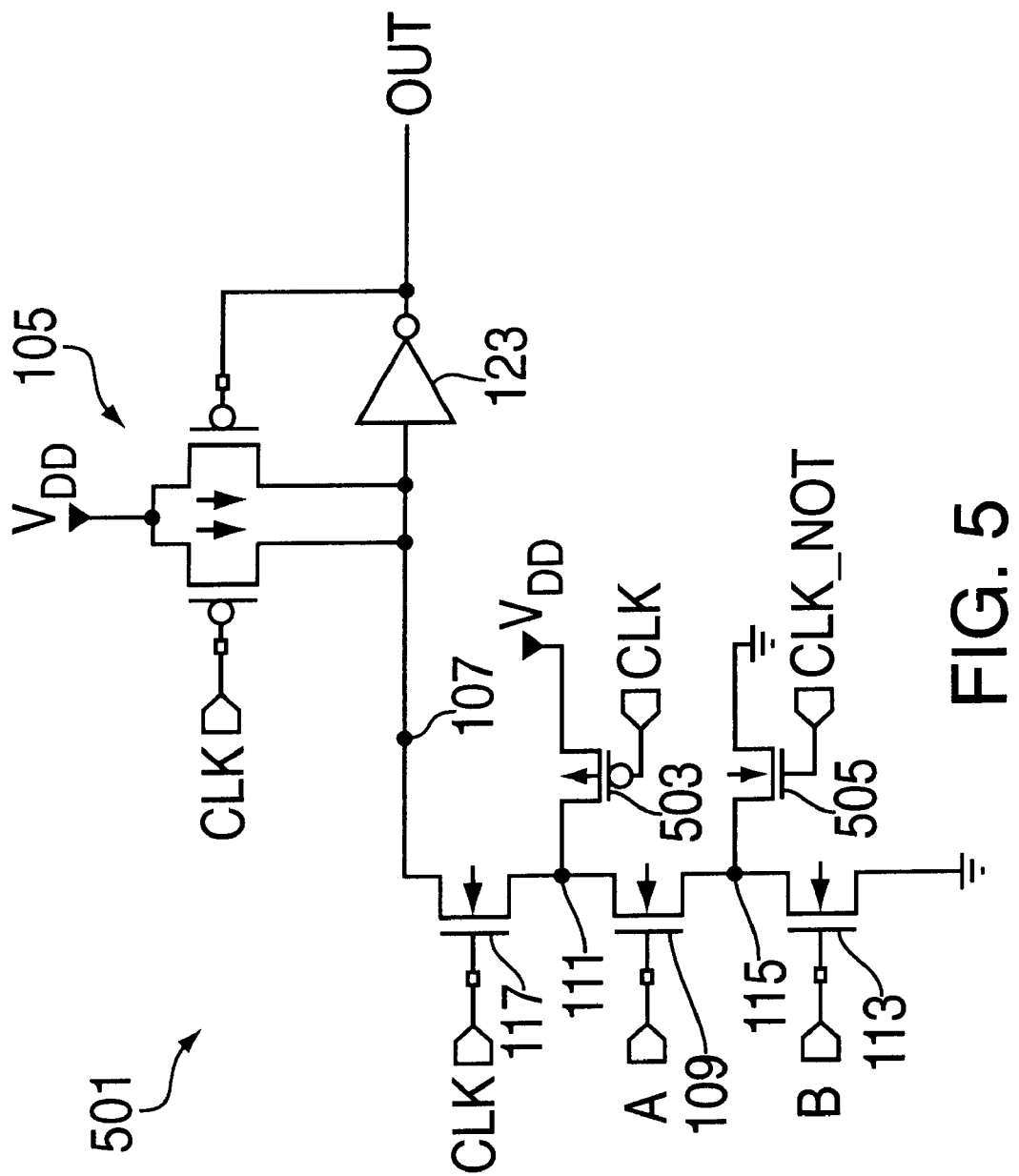
FIG. 5 is a schematic diagram of an inventive top clock stacked circuit configured in accordance with the present invention.

FIG. 5 is a schematic diagram of an inventive top clock stacked circuit 501 that eliminates both charge sharing and any deleterious bipolar effect. The inventive top clock stacked circuit 501 comprises all of the components of the conventional top clock stacked circuit 401 of FIG. 4, plus a pre-charge PFET 503 and a pre-discharge NFET 505. The pre-charge PFET 503 has a source coupled to $V_{DD}$, a drain coupled to the first node 111 and a gate which serves as a CLK input. The pre-discharge NFET 505 has a source coupled to ground, a drain coupled to the second node 115 and a gate which serves as an inverse clock (CLK_NOT) input.

Figure 1:
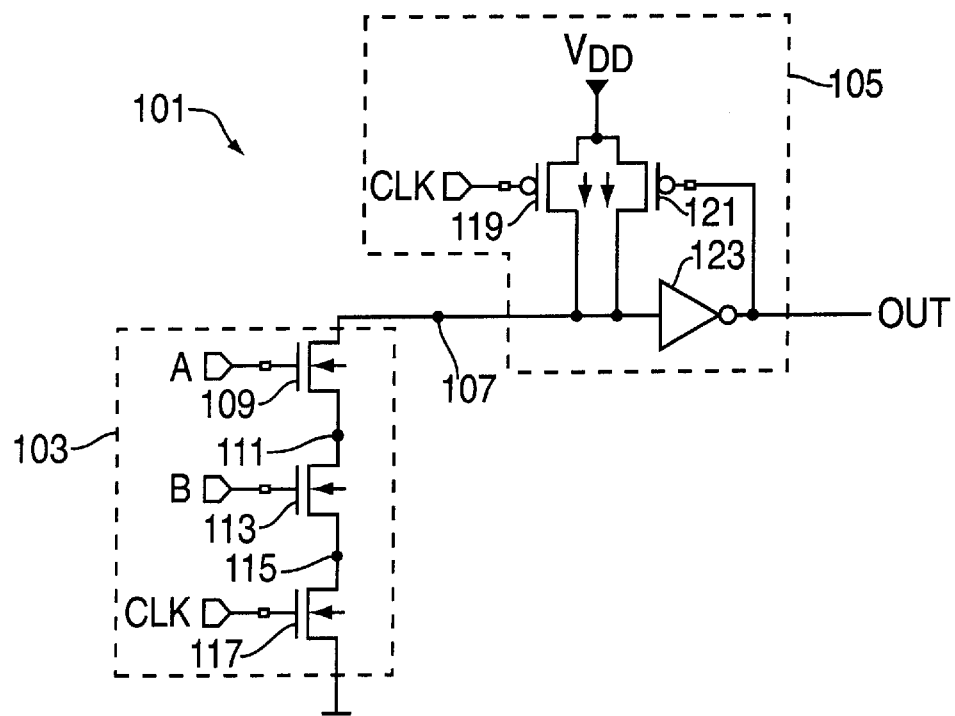
FIG. 1 is a schematic diagram of a traditional stacked circuit, as previously described.
Figure 2:
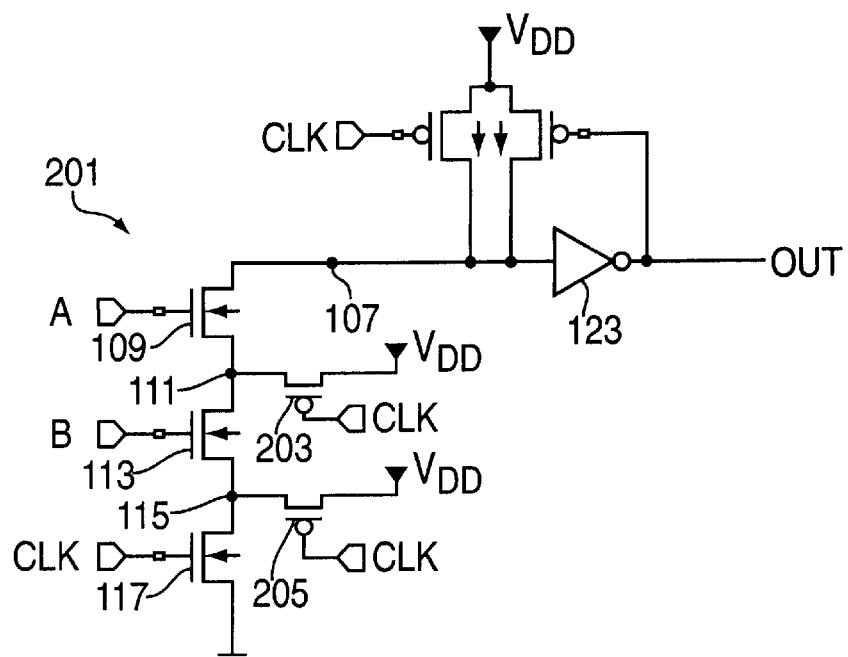
FIG. 2 is a schematic diagram of a conventional pre-charged stacked circuit, as previously described.
Figure 3:
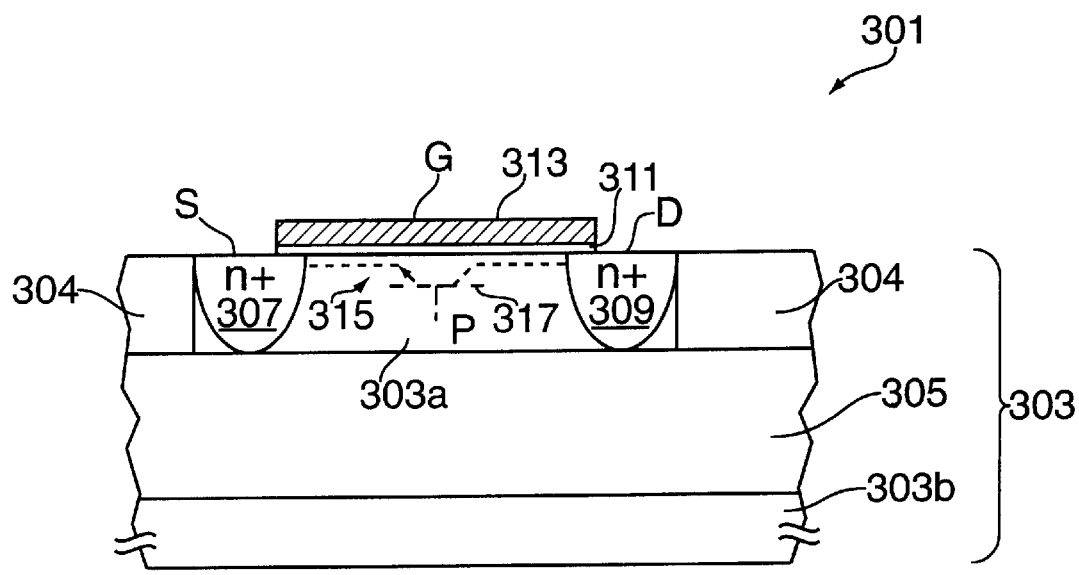
FIG. 3 is a cross-sectional view of a typical SOI NFET, as previously described.

The inventive top clock stacked circuit 501 performs the same logic AND function as the conventional stacked circuits 101, 201 and 401 of FIGS. 1–2 and 4. However, unlike the conventional stacked circuits 101, 201 and 401, the inventive top clock stacked circuit 501 does not suffer from charge sharing or any deleterious bipolar effect. For example, when the CLK polarity is low, the dynamic node 107 and the first node 111 are charged to $V_{DD}$ via the dynamic node pre-charge circuit 105 and the pre-charge PFET 503, respectively, and the second node 115 is grounded. Thereafter, when the CLK polarity is switched high (turning ON the third NFET 117), and the A input is held low, charge sharing between the dynamic node 107 and the first node 111 through the third NFET 117 is prevented because the dynamic node 107 and the first node 111 are pre-charged to the same voltage (e.g., $V_{DD}$). The dynamic node 107, therefore, remains charged at $V_{DD}$, and the output of the inventive top clock stacked circuit 501 remains at its proper logic state (e.g., the low logic state).

With respect to the bipolar effect, if the third NFET 117 is OFF (e.g., if the clock polarity is low), and if both the A input and the B input are held high, the first NFET 109 and the second NFET 113 are turned ON and the first node 111 (and thus the source of the third NFET 117) is pulled low. With the drain of the third NFET 117 held at $V_{DD}$ via the dynamic node 107, the source of the third NFET 117 grounded and the top p-type bulk silicon region 303a of the third NFET 117 floating near $V_{DD}$ (e.g., due to the pre-charging of the first node 111 by the pre-charge PFET 503), the parasitic npn transistor 317 within the third NFET 117 turns ON. However, like the dynamic node pre-charge circuit 105 of the conventional top clock stacked circuit 401, the dynamic node pre-charge circuit 105 of the inventive top clock stacked circuit 501 maintains the dynamic node 107 at $V_{DD}$ as the charge within the top p-type bulk silicon region 303a of the third NFET 117 is drained away. The bipolar effect within the third NFET 117, therefore, has no affect on the inventive top clock stacked circuit 501's output.

Unlike the conventional top clock stacked circuit 401, however, the inventive top clock stacked circuit 501 is not susceptible to the bipolar effect produced within the first NFET 109 of the conventional top clock stacked circuit 401. Because the second node 115 is pre-discharged to ground by the pre-discharge NFET 505 when the CLK polarity is low, the top p-type bulk silicon region 303a of the first NFET 109 is precluded from rising to a sufficient voltage to forward bias the base-emitter junction of the parasitic npn transistor 317 within the first NFET 109. For example, if the CLK polarity is switched high, the A input is held low, and the B input is held high, the second NFET 113 and the third NFET 117 are turned ON. Accordingly, the dynamic node 107 is coupled to the first node 111, the drain of the first NFET 109 is held at $V_{DD}$ by the dynamic node 107, and the source of the first NFET 109 is grounded. Because the top p-type bulk silicon region 303a of the first NFET 109 is at a voltage insufficient to forward bias the base-emitter junction of the first NFET 109's parasitic npn transistor 317, the parasitic npn transistor 317 remains OFF, and the bipolar effect within the first NFET 109 is averted. Accordingly, unlike the traditional stacked circuit 101, the conventional pre-charged stacked circuit 201 and the conventional top clock stacked circuit 401 of FIGS. 1–2 and 4, the inventive top clock stacked circuit 501 suffers from neither charge sharing nor any deleterious bipolar effect.

The foregoing description discloses only the preferred embodiments of the invention, modifications of the above disclosed apparatus and method which fall within the scope of the invention will be readily apparent to those of ordinary skill in the art. For instance, the pre-discharge NFET 505 may be replaced with a pre-discharge PFET having a gate which serves as a CLK input. Further, while the inventive top clock stacked circuit 501 was described with reference to $V_{DD}$ and ground, it will be understood that any other voltage rails may be similarly employed (e.g., $V_{SS}$ rather than ground). Additional elements may be added to the stack between the second NFET 113 and ground so as to form additional secondary nodes that should be pre-discharged in a manner similar to the method used to pre-discharge the second node 115.

Accordingly, while the present invention has been disclosed in connection with the preferred embodiments thereof, it should be understood that other embodiments may fall within the spirit and scope of the invention, as defined by the following claims.

The invention claimed is:

1. A circuit comprising:
 a primary node including a primary pre-charge means for pre-charging the primary node in response to a first clock polarity;
 a plurality of devices coupled in series to the primary node, wherein common points between the plurality of devices comprise secondary nodes, each device for coupling together nodes adjacent to it in response to an input signal, a first one of the devices adjacent the primary node and a first secondary node, a second one of the devices adjacent the first secondary node and a second secondary node;
 the first secondary node including a secondary pre-charge means for pre-charging the first secondary node in response to the first clock polarity;
 the second secondary node including a pre-discharge means for discharging the second secondary node in response to the first clock polarity; and
 wherein a pre-charging of the primary node and the first secondary node substantially prevents a charge transfer between the primary node and the first secondary node when they are coupled together.

2. The circuit of claim 1 wherein the primary node and the first secondary node are coupled together in response to a second clock polarity received as an input signal to the first one of the devices, the second clock polarity immediately following the first clock polarity.

3. The circuit of claim 1 wherein a pre-discharging of the second secondary node prevents a parasitic current flow from the first secondary node to the second secondary node when the second one of the devices has not coupled the first and second secondary nodes.

4. A circuit comprising:
 a primary node;
 a primary pre-charge circuit coupled to the primary node, the primary pre-charge circuit for pre-charging the primary node in response to a first clock polarity;
 a first secondary node;
 a first device coupled between the primary node and the first secondary node, the first device for coupling the primary node to the first secondary node in response to a first input signal;
 a second secondary node;
 a second device coupled between the first secondary node and the second secondary node, the second device for coupling the first secondary node to the second secondary node in response to a second input signal,
 a secondary pre-charge circuit coupled to the first secondary node, the secondary pre-charge circuit for pre-charging the first secondary node in response to the first clock polarity; and
 a pre-discharge circuit coupled to the second secondary node, the pre-discharge circuit for discharging the second secondary node in response to the first clock polarity;
 wherein pre-charging the primary node and the first secondary node substantially prevents charge transfer between the primary node and the first secondary node when the primary node and the first secondary node are coupled together.

5. The circuit of claim 4 wherein the primary node and the first secondary node are coupled together in response to a second clock polarity received as the first input signal to the first device, the second clock polarity immediately following the first clock polarity.

6. The circuit of claim 4 wherein pre-discharging the second secondary node prevents parasitic current flow from the first secondary node to the second secondary node when the second device has not coupled the first and the second secondary nodes.

7. The circuit of claim 4 wherein the primary node comprises a dynamic node and wherein the primary pre-charge circuit comprises a dynamic node pre-charge circuit.

8. The circuit of claim 7 wherein the first device comprises:

a first NFET having a drain coupled to the dynamic node, a source coupled to the first secondary node, and a gate for turning ON the first NFET in response to said first input signal so as to couple the primary node to the first secondary node; and wherein the second device comprises a second NFET having a drain coupled to the first secondary node, a source coupled to the second secondary node, and a gate for turning ON the second NFET in response to said second input signal so as to couple the first secondary node to the second secondary node.

9. The circuit of claim 8 wherein the first input signal comprises a second clock polarity and wherein the second input signal comprises a logic state.

10. The circuit of claim 4 wherein the primary pre-charge circuit comprises:

a first PFET having a source for coupling to a voltage rail, a drain coupled to the primary node, and a gate for turning ON the first PFET in response to the first clock polarity so as to pre-charge the primary node;

an inverter having an input coupled to the primary node and an output; and a second PFET having a source for coupling to the voltage rail, a drain coupled to the primary node and a gate coupled to the output of the inverter.

11. The circuit of claim 4 wherein the secondary pre-charge circuit comprises a PFET having a source for coupling to a voltage rail, a drain coupled to the first secondary node and a gate for turning ON the PFET in response to the first clock polarity so as to pre-charge the first secondary node.

12. The circuit of claim 4 wherein the pre-discharge circuit comprises an NFET having a drain coupled to the second secondary node, a source for coupling to ground and a gate for turning ON the NFET in response to the first clock polarity so as to pre-discharge the second secondary node.

13. The circuit of claim 4 further comprising a third device coupled to the second secondary node and for coupling to ground, the third device for coupling the second secondary node to ground in response to a third input signal.

14. The circuit of claim 13 wherein the third device comprises an NFET having a drain coupled to the second secondary node, a source for coupling to ground, and a gate for turning ON the NFET in response to said third input signal so as to couple the second secondary node to ground.

15. An AND logic circuit comprising the circuit of claim 4.

16. A method for substantially preventing charge sharing within a stacked circuit having a primary pre-charge circuit coupled to a primary node, the primary pre-charge circuit for pre-charging the primary node in response to a first clock polarity, a first device coupled between the primary node and a first secondary node, the first device for coupling the primary node to the first secondary node in response to a second clock polarity, and a second device coupled between the first secondary node and a second secondary node, the second device for coupling the first secondary node to the second secondary node in response to a first input signal, the method comprising:

providing a secondary pre-charge circuit;

coupling the secondary pre-charge circuit to the first secondary node;

pre-charging the first secondary node with the secondary pre-charge circuit prior to receipt of the second clock polarity by the first device;

providing a pre-discharge circuit;

coupling the pre-discharge circuit to the second secondary node; and pre-discharging the second secondary node with the pre-discharge circuit prior to receipt of the second clock polarity by the first device so as to prevent parasitic current flow from the first secondary node to the second secondary node upon receipt of the second clock polarity.

17. The method of claim 16 wherein providing the pre-discharge circuit comprises providing an NFET having a source for coupling to ground, a drain for coupling to the second secondary node and a gate for turning ON the NFET in response to the first polarity clock so as to pre-discharge the second secondary node.

* * * * *